(12) United States Patent
Cheng

(10) Patent No.: US 11,315,836 B2
(45) Date of Patent: Apr. 26, 2022

(54) TWO-DIMENSIONAL VERTICAL FINS

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/809,157

(22) Filed: Mar. 4, 2020

(65) Prior Publication Data

US 2021/0280470 A1    Sep. 9, 2021

(51) Int. Cl.
| | |
|---|---|
| *H01L 21/8234* | (2006.01) |
| *H01L 21/306* | (2006.01) |
| *H01L 29/06* | (2006.01) |
| *H01L 29/78* | (2006.01) |
| *H01L 29/66* | (2006.01) |

(52) U.S. Cl.
CPC ........ *H01L 21/823487* (2013.01); *H01L 21/30612* (2013.01); *H01L 29/0692* (2013.01); *H01L 29/66666* (2013.01); *H01L 29/7827* (2013.01)

(58) Field of Classification Search
CPC combination set(s) only.
See application file for complete search history.

(56) References Cited

U.S. PATENT DOCUMENTS

| | | |
|---|---|---|
| 3,728,179 A | 4/1973 | Davidson et al. |
| 4,449,285 A | 5/1984 | Janes et al. |
| 6,245,685 B1 | 6/2001 | Sung et al. |
| 7,132,324 B2 | 11/2006 | Cheng et al. |
| 9,245,885 B1 | 1/2016 | Xie et al. |
| 9,761,728 B1 | 9/2017 | Cheng et al. |
| 9,805,935 B2 | 10/2017 | Anderson et al. |
| 10,083,877 B1 | 9/2018 | Sano et al. |
| 10,290,681 B2 | 5/2019 | Yeh et al. |
| 2003/0102518 A1* | 6/2003 | Fried ............... H01L 27/1203 257/401 |
| 2009/0051003 A1 | 2/2009 | Cheng et al. |
| 2015/0214099 A1* | 7/2015 | Grenouillet ......... H01L 21/3065 438/424 |

* cited by examiner

*Primary Examiner* — Hsien Ming Lee
(74) *Attorney, Agent, or Firm* — Tutunjian & Bitetto, P.C.; Robert Sullivan

(57) ABSTRACT

A method of forming a two dimensional (2D) vertical fin is provided. The method includes heat treating a periodic array of irregular openings in a substrate, wherein there are walls of substrate material between adjacent openings, to reduce the surface area of the openings, and etching the openings with a crystal-plane selective etch to form squared openings in the substrate.

20 Claims, 12 Drawing Sheets

TWO-DIMENSIONAL VERTICAL FINS

BACKGROUND

The present invention generally relates to vertical fins extending in two lateral dimensions, and more particularly to fin field effect transistor (FinFET) devices having fins extending in two lateral dimensions.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a vertical fin having multiple arms is provided. The method includes heat treating a periodic array of irregular openings in a substrate, wherein there are walls of substrate material between adjacent openings, to reduce the surface area of the openings, and etching the openings with a crystal-plane selective etch to form squared openings in the substrate.

In accordance with another embodiment of the present invention, a method of forming a vertical fin having multiple arms is provided. The method includes forming a periodic array of irregular openings in a substrate, wherein there are walls of substrate material between adjacent openings. The method further includes heat treating the substrate and openings to reduce the surface area of the openings, and etching the openings with a crystal-plane selective etch to form squared openings in the substrate.

In accordance with yet another embodiment of the present invention, a two-dimensional vertical fin field effect transistor device is provided. The device includes a two-dimensional vertical fin having intersecting arms with atomically sharp corners where perpendicular crystal planes meet.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
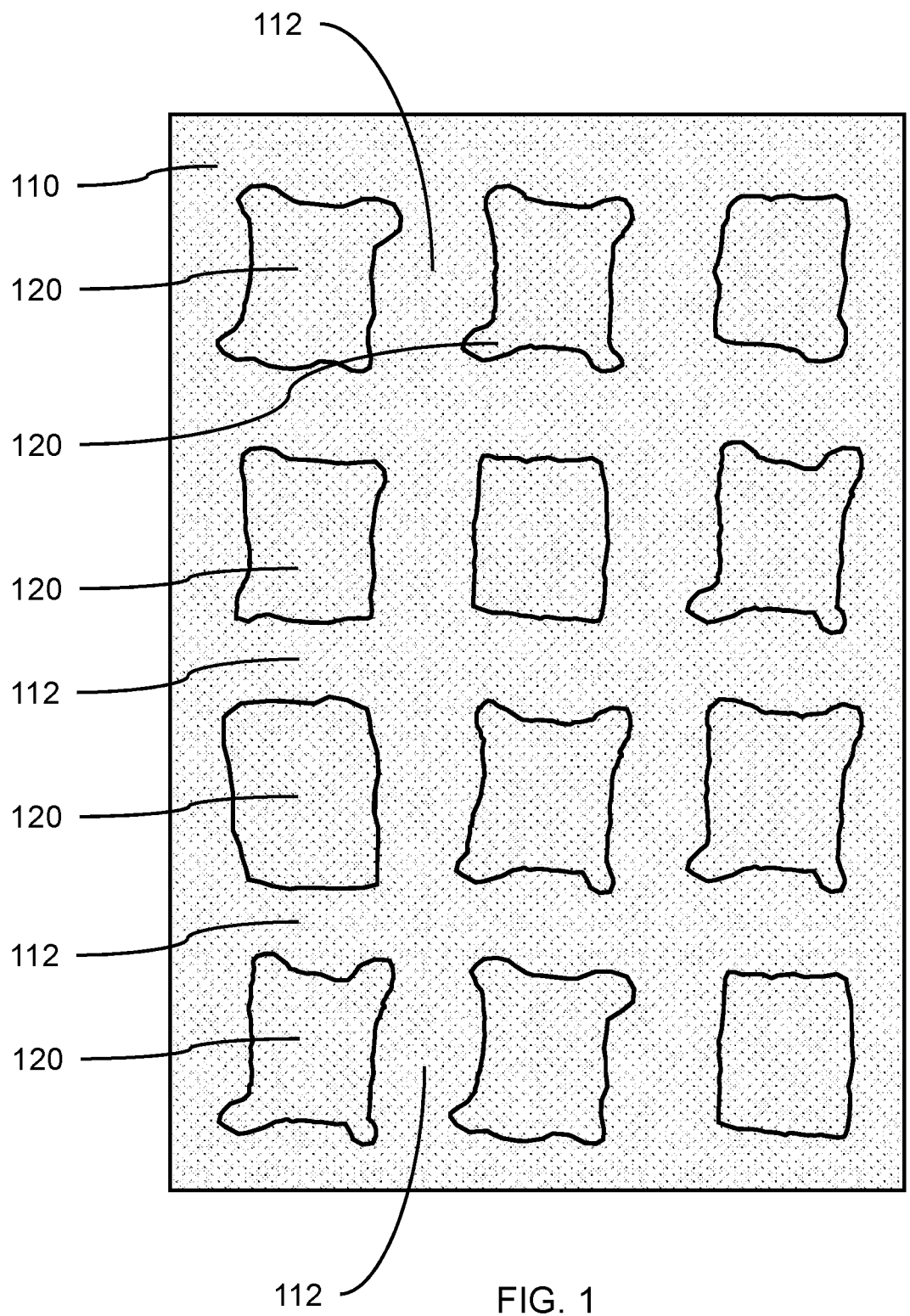
FIG. 1 is a top view showing a periodic array of irregular openings formed in a substrate, in accordance with an embodiment of the present invention.

Embodiments of the present invention relate to two-dimensional vertical fins and fin field effect transistor (FinFET) devices having multiple arms extending from points of intersection to form a two-dimensional (2D) vertical fin when viewed from the top. The vertical fins can extend vertically from a substrate surface and have multiple arms extending in two lateral dimensions parallel to the plane of the substrate, where the arms of the vertical fin can intersect at perpendicular angles. Multiple vertical fins can cross each other to form a two-dimensional cross shape, fence, or lattice structure, when viewed from the top. To increase the effective transistor width and thus increase the drive current for a given footprint of a chip area, a two-dimensional (2D) fin can be used instead of one-dimensional (1D) fin (e.g., a vertical fin without arms or branch points, a linear vertical fin). A two-dimensional vertical fin can have a cross shape, an H-shape, a fence shape, or a lattice-shape, where two or more arms intersect at square corners.

Embodiments of the present invention relate to the fabrication of two-dimensional vertical fins and fin field effect transistor (FinFET) devices having a two-dimensional vertical fin. Two-dimensional vertical fins can be formed from a regular (or periodic) array of openings in a substrate using a subtractive etch that leaves the intervening walls between adjacent openings (e.g., vias) as fins extending upwards from the etched substrate surface.

Embodiments of the present invention relate to two-dimensional vertical fins and fin field effect transistor (FinFET) devices having reduced corner rounding at the intersection of the perpendicular arms forming the vertical fin. Rounded corners at the intersection of the 2D fin arms (i.e., corner rounding) can cause variations in fin channel thickness and thus device performance variations between different devices on the same region of the substrate.

Embodiments of this invention provide a fabrication method that forms a 2D fin with sharp corners at the intersection of the fin arms by using a 2-step process—(1) annealing to reduce the irregularity of the shape of trench sidewalls, and (2) performing a crystalline orientation dependent etching to sharpen the corners of 2D fin. Use of an etch chemistry that is selective for a particular crystal plane (e.g., {110}) of the semiconductor substrate material can form consistent, sharp corners at the intersection of the perpendicular arms forming the vertical fin(s), which reduces the variation in device geometries, fin channel thicknesses, and device performance characteristics. The corners at the intersection of the perpendicular arms can be square corners, where the perpendicular crystal plane (e.g., {110} and {−110}) meet at approximately 90 degrees (+/−1 degree). In various embodiments, a two-dimensional vertical fin can have intersecting arms with atomically sharp corners, where perpendicular crystal planes meet.

Embodiments of the present invention relate to the fabrication of vertical transport fin field effect transistor (VT FinFET) devices having a two-dimensional vertical fin with two-dimension top source/drains and wrap-around gate structures. A top source/drain can be epitaxially grown on the top surface of the two-dimensional vertical fin to have the matching shape. A gate dielectric layer can be conformally formed on the various parallel and intersecting walls of the two-dimensional vertical fin, and a gate conductor can be formed around the device using a blanket deposition and patterning techniques.

Exemplary applications/uses to which the present invention can be applied include, but are not limited to: logic device (e.g., gates, processors, FPGAs, etc.), memory devices (e.g., SRAM, DRAM), and application specific integrated circuits (ASICs).

It is to be understood that aspects of the present invention will be described in terms of a given illustrative architecture; however, other architectures, structures, substrate materials and process features and steps can be varied within the scope of aspects of the present invention.

Referring now to the drawings in which like numerals represent the same or similar elements and initially to FIG. 1, a top view of a periodic array of irregular openings formed in a substrate is shown, in accordance with an embodiment of the present invention.

In one or more embodiments, a series of openings 120 (i.e., holes, vias, cavities, etc.) can be formed in a substrate 110, where the openings 120 can be formed in a regular or periodic array. The array can be in a square lattice (i.e., rows and columns), a rectangular lattice, or a hexagonal lattice with vertical columns or horizontal rows, although other period array are also contemplated. The openings 120 can be formed by lithography and etching (or any other suitable patterning techniques, such as self-aligned multiple patterning (SAMP)), where the openings 120 can have an irregular shape. In various embodiments, the openings can have an irregular shape that is lobular or rectangular with or without protuberances, where the lobes or protuberances can be at the corners of square or rectangular shaped openings 120. The interior surfaces of the openings 120 can also be rough and uneven. The etching can be a selective, directional etch, for example, a reactive ion etch (RIE).

In various embodiments, the substrate 110 can be a semiconductor material. In various embodiments, the substrate 110 can be single crystal silicon (c-Si) substrate. The single crystal silicon can have {110} crystal planes perpendicular to the surface of the substrate. In various embodiments, silicon-germanium (SiGe) and germanium (Ge) materials can be used as the substrate, where they have similar crystalline structure compared to silicon (Si) that provides perpendicular crystal planes (e.g., {110}) that can be selectively etched. In various embodiments, the substrate material can be a III-V semiconductor material, where the substrate has, for example, a {111} crystal plane that be selectively etched.

In various embodiments, the openings can have a diameter in a range of about 15 nanometers (nm) to about 100 nm, or about 30 nm to about 50 nm, although other diameters are also contemplated. The diameter can be calculated as the average of the length of the line which connects the two farthest boundary points and passes through the centroid (C) and the length of the line which connects the two nearest boundary points and passes through the centroid.

In various embodiments, the openings 120 can be separated by a wall 112 having a thickness in a range of about 5 nm to about 20 nm, or about 10 nm to about 15 nm, although other thicknesses are also contemplated. The wall thickness can be the average of the distances between multiple points horizontally, vertically, or diagonally opposite reference points on an opening 120 (and parallel with the period planes of the lattice). The openings 120 can be arranged in a regular pattern having a predetermined pitch that determines the thickness of the walls 112 between the openings. A rectangular lattice can provide walls with different thicknesses laterally between openings in the same row or column. A rectangular lattice can have walls with different thicknesses between horizontally adjacent openings compared to vertically adjacent openings.

Figure 2:
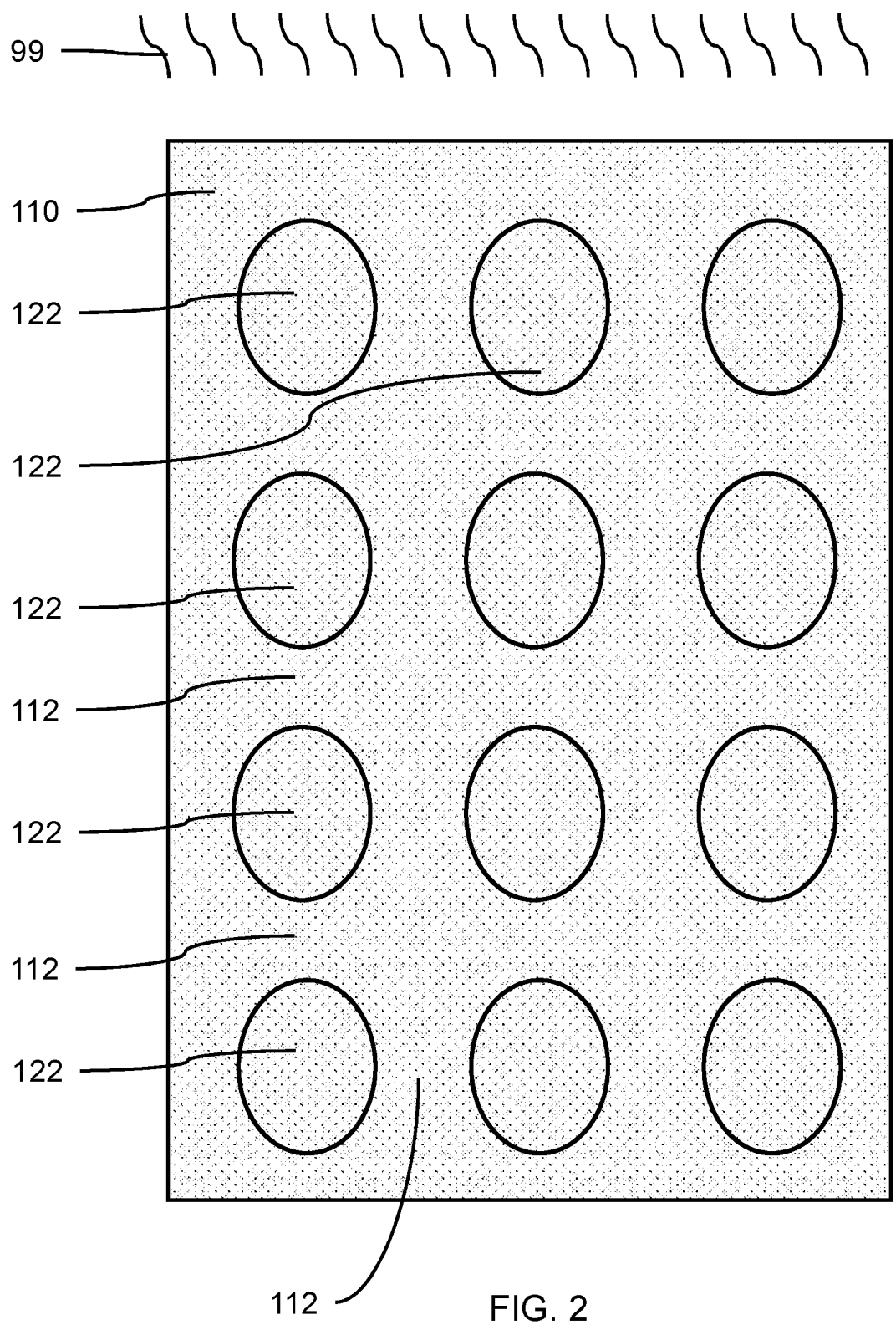
FIG. 2 is a top view showing the irregular openings partially reflowed to increase the shape regularity, in accordance with an embodiment of the present invention.

FIG. 2 is a top view showing the irregular openings partially reflowed to increase the shape regularity, in accordance with an embodiment of the present invention.

In one or more embodiments, the substrate 110 with the openings 120 can be heat treated 99 to allow the material of the substrate to reflow under the force of surface free energy to increase the regularity of the openings' shapes and convert the irregularly shaped openings 120 first to elliptically shaped openings 122 then to round openings. Without intending to be limited by theory, it is believed that high energy features, such as corners, lobes, and protuberances, as well as surface roughness, can become more rounded or eliminated to reduce the perimeter and surface area of each of the openings and thereby reduce the surface free energy of the openings 120. The surface free energy (also referred to as surface energy) quantifies the disruption of intermolecular bonds that occur at a surface, and therefore atoms at a surface or interface can have a higher energy than atoms within the bulk of a material that are fully coordinated. A larger surface implies a higher surface energy. A reduction in surface area can reduce the surface free energy and increase the stability of a surface. By increasing the temperature, more atoms can achieve the activation energy to migrate to coordination positions that reduce the number of surface atoms. At higher temperatures a solid material can creep, such that the volume of the solid remains essentially the same but the surface area changes. The surface energy can be anisotropic, such that different crystal face of a crystalline material have different free energies, that can affect the change in surface areas of different crystal faces. For example, the (111) plane of single crystal silicon has a measured surface energy reported as 1240 mJ/m². In various embodiments, the irregularly shaped openings 120 can reflow into elliptically-shaped openings 122, as the lobes or protuberances are eliminated and the radii of corner(s) increase. The surface roughness of the openings can also be reduced by the heat treating and reflow. The elliptically-shaped openings 122 can remain in the square, rectangular, or hexagonal lattice arrangement as the openings undergo the heat treatment.

In various embodiments, the heat treatment can be a furnace anneal, a rapid thermal anneal (RTA), a flash anneal, a laser anneal, or any suitable combination of the annealing techniques.

In various embodiments, the heat treatment can be conducted at a temperature in a range of about 400° C. to about 1200° C., or about 600° C. to about 1000° C., or about 700° C. to about 900° C., although other temperatures below the melting point of the substrate material are also contemplated.

In various embodiments, the heat treatment can be conducted for a duration in a range of about 5 seconds (sec) to about 30 minutes (min), or about 30 sec to about 10 min, or about 30 sec to about 3 min. The annealing time can depend on the heat treating temperature and substrate material, where, for a given substrate material, the higher the annealing temperature, the shorter the annealing time can be.

In various embodiments, the heat treatment can be conducted in a reducing atmosphere, for example, hydrogen gas ($H_2$), deuterium ($D_2$), and combinations thereof. In various embodiments, the annealing environment may further include other chemically inert gases, including, but not limited to, nitrogen ($N_2$), helium (He), argon (Ar), neon (Ne), and combinations thereof.

In various embodiments, the heat treating atmosphere can be at a pressure in a range of about 10 milli-Torr (mTorr) to about 10 Torr, or about 30 mTorr to about 200 mTorr, although other pressures are also contemplated, where the pressure includes the reducing and inert gasses present. The listed ranges of annealing temperature, time, and pressure, are not intended to be limiting.

Figure 3:
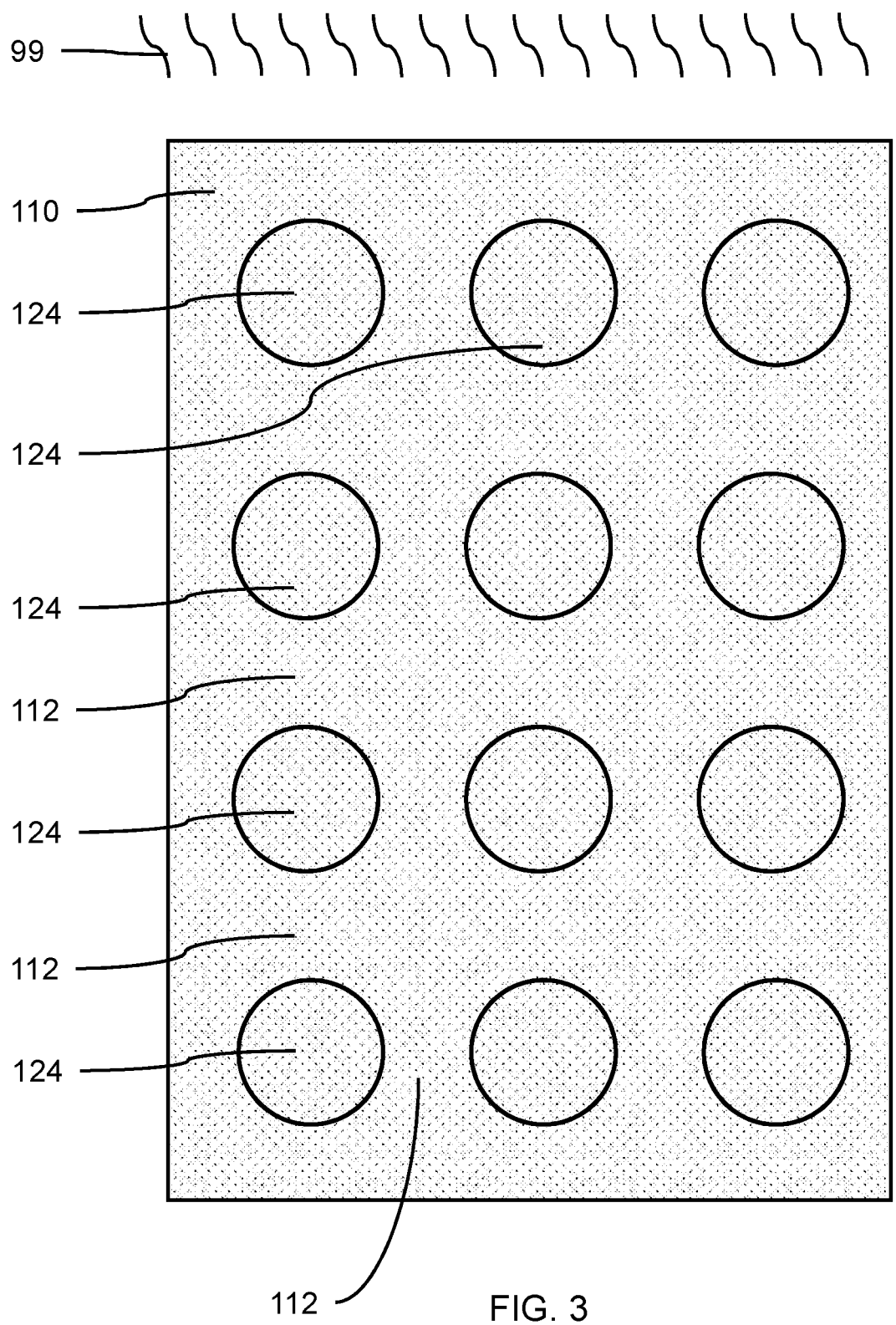
FIG. 3 is a top view showing the elliptical openings further reflowed to increase the shape regularity and form rounded openings, in accordance with an embodiment of the present invention.

FIG. 3 is a top view showing the elliptical openings further reflowed to increase the shape regularity and form rounded openings, in accordance with an embodiment of the present invention.

In one or more embodiments, the heat treatment can be continued until the elliptically-shaped openings 122 become circular openings 124 by minimizing the surface free energy. The elliptical openings 122 can be converted to round circular openings 124.

Figure 4:
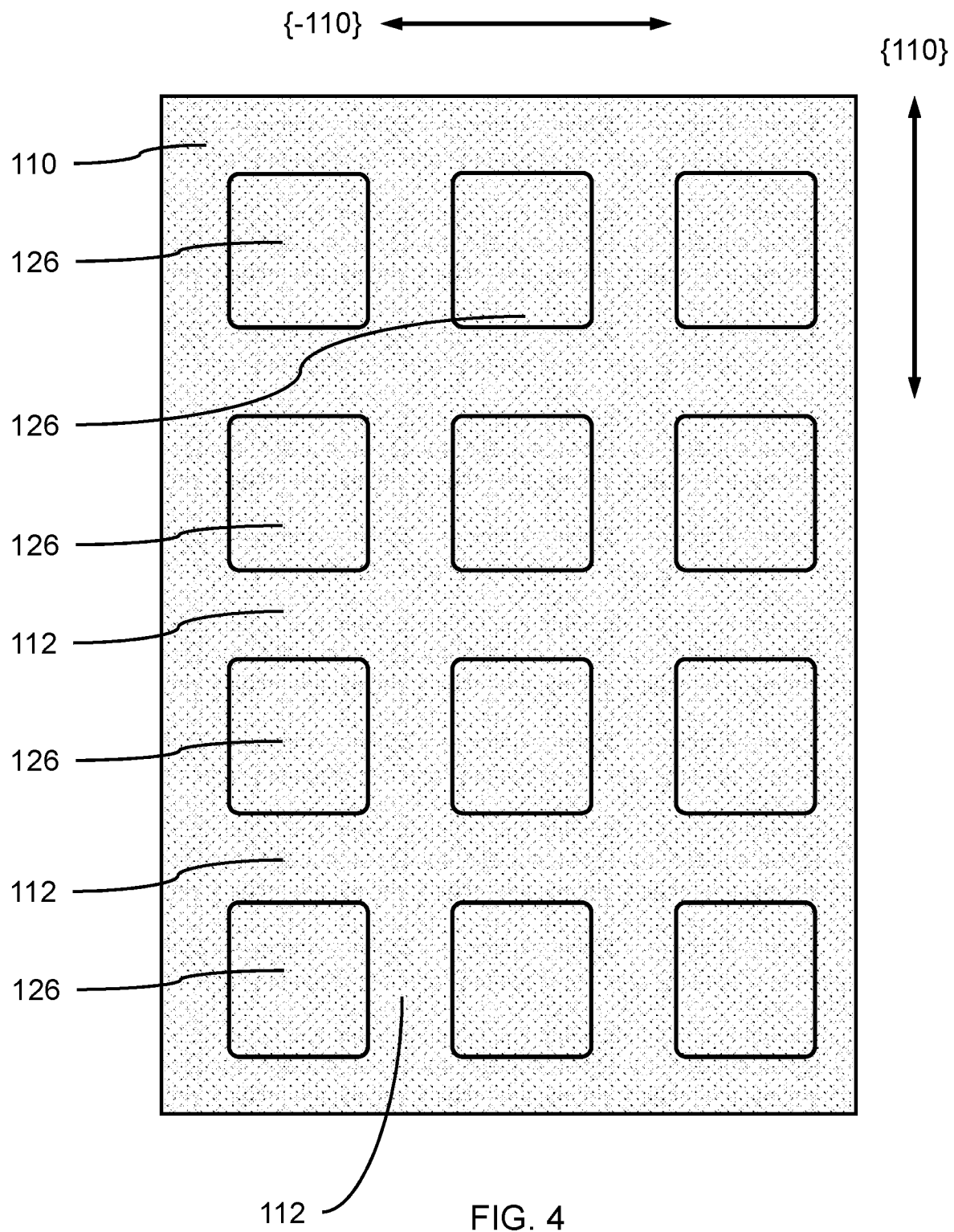
FIG. 4 is a top view showing the rounded openings etched by a crystal plane selective etch to form squared openings in the substrate, in accordance with an embodiment of the present invention.

FIG. 4 is a top view showing the rounded openings etched by a crystal plane selective etch to form squared openings in the substrate, in accordance with an embodiment of the present invention.

In one or more embodiments, the openings can be etched using a crystal plane selective etch to form square openings 126 from the circular openings 124, where the crystal plane selective etch can depend on the material selected for the substrate 110. If the etch is performed after forming the structure shown in FIG. 2, with elliptically-shaped openings, then after etching the opening shape will be rectangular. In various embodiments, the crystal plane selective etch can be conducted for a period of time sufficient to square the corners at intersecting arms of the two-dimensional vertical fin, where a squared opening or intersection has a radius of less than half the initial radius formed at intersecting arms by lithographic processes without a subsequent crystal plane selective etch.

In various embodiments, the etch can be a wet etch or gas phase etch. A crystal plane selective etch can be chosen based on the substrate material being etched. For a wet chemical etch, an aqueous solution containing any of following etchants may be used: ammonium hydroxide (in aqueous solution) ($NH_4OH$), tetramethyl ammonium hydroxide (TMAH, $(CH_3)_4NOH$), ethylene diamine and pyrocatechol (EDP), potassium hydroxide (KOH), and suitable combinations thereof. In various embodiments, the wet etch temperature can be in a range of about 0° C. to about 90° C., or about 23° C. to about 75° C., although other temperatures are also contemplated.

In various embodiments, the etch can be a gas phase etch, including, but not limited to hydrogen chloride (HCl), where the etch can be conducted at a temperature in a range of about 450° C. to about 800° C., although other temperatures are also contemplated.

In a non-limiting exemplary embodiment, an ammonia wet etch (ammonium hydroxide ($NH_3OH$)) can be used to selectively etch the {110} planes (and {−110} planes) of single crystal silicon (Si) to form square openings 126 in the substrate 110. The ammonia wet etch is self-limiting, so the ammonia etch can be used to form atomically sharp corners in each of the circular openings 124 where the {110} and {−110} planes intersect by letting the etch go to completion.

Figure 5:
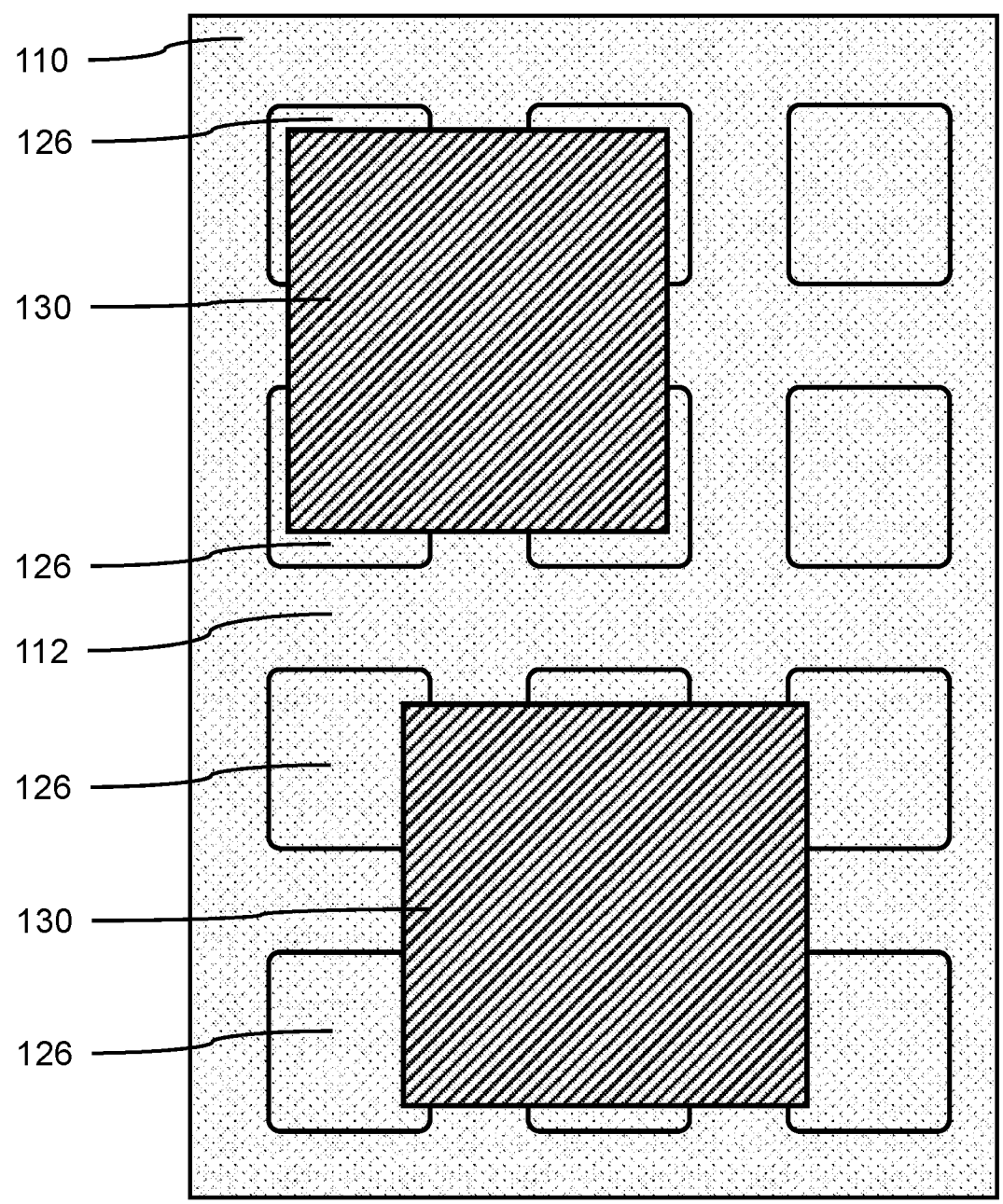
FIG. 5 is a top view showing the squared openings selectively masked, in accordance with an embodiment of the present invention.

FIG. 5 is a top view showing the squared openings selectively masked, in accordance with an embodiment of the present invention.

In one or more embodiments, portions of the square openings 126 and intervening walls 112 can be covered by a mask 130, which can include a hard mask, a soft mask, or both. The mask 130 can be patterned using lithographic techniques and etching to expose portions of the square openings 126 and surrounding substrate 110, but cover portions of two or more intersecting walls 112. In various embodiments, two perpendicular walls 112 and four square openings 126 in a square arrangement can be at least partially covered by the mask 130 to form a cross-shaped 2D vertical fin or H-shaped 2D vertical fin.

Figure 6:
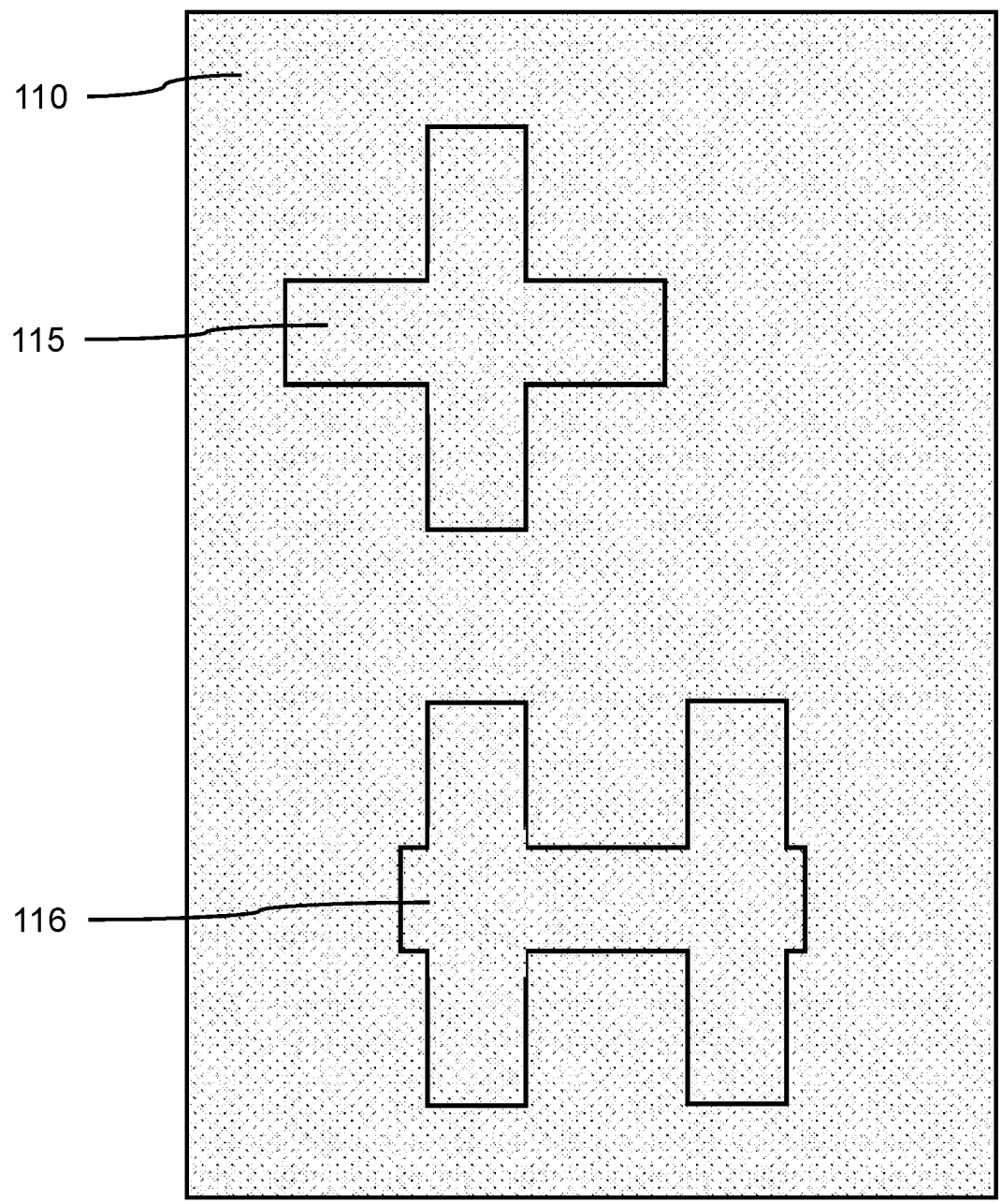
FIG. 6 is a top view showing two-dimensional vertical fins formed from the masked, squared openings, in accordance with an embodiment of the present invention.

FIG. 6 is a top view showing two-dimensional vertical fins formed from the masked, squared openings, in accordance with an embodiment of the present invention.

In one or more embodiments, a cross-shaped vertical fin 115 can be formed be removing the surrounding portions of the substrate, while the masked portion of the walls 112 between four (4) square openings 126 remain on the substrate 110. An H-shaped vertical fin 116 can be formed be removing the surrounding portions of the substrate, while the masked portion of the walls 112 between six (6) square openings 126 remain on the substrate 110.

In various embodiments, the mask(s) 130 can be removed after etching the substrate 110 to form the cross-shaped vertical fin 115 or H-shaped vertical fin 116. The mask can be removed by ashing, selective etching, or a combination thereof.

Figure 7:
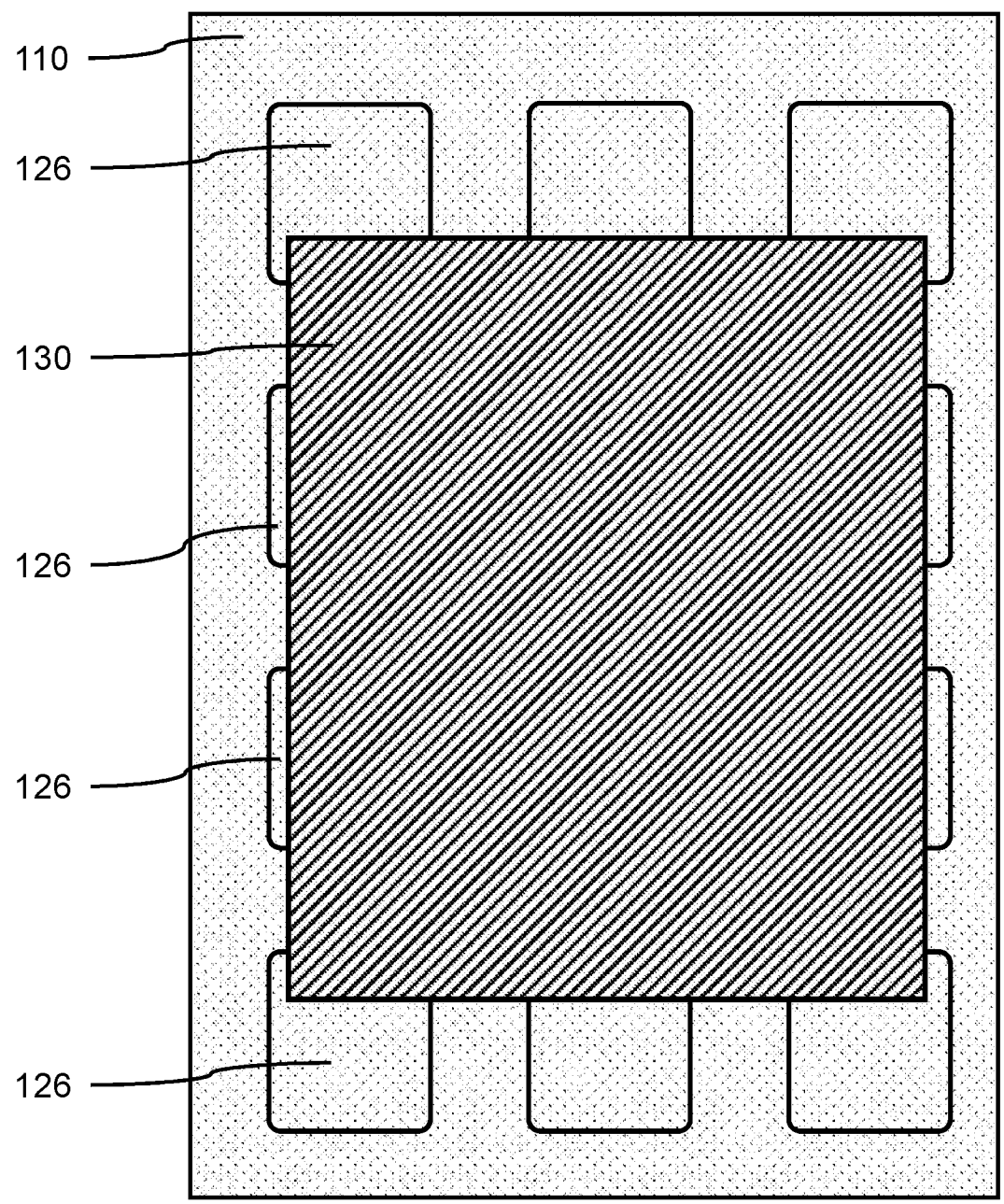
FIG. 7 is a top view showing the squared openings covered by a larger mask to form an extended vertical fin array, in accordance with an embodiment of the present invention.

FIG. 7 is a top view showing the squared openings covered by a larger mask to form an extended vertical fin array, in accordance with an embodiment of the present invention.

In one or more embodiments, portions of the square openings 126 and intervening walls 112 can be covered by a mask 130, where a larger mask 130 can cover square openings 126 and the intervening walls 112 in multiple rows and columns. A predetermined number of M rows and N columns of square openings 126 can be covered by the mask 130 to form a lattice-type vertical fin having multiple intersecting walls 112, where M>3 and N>3.

Figure 8:
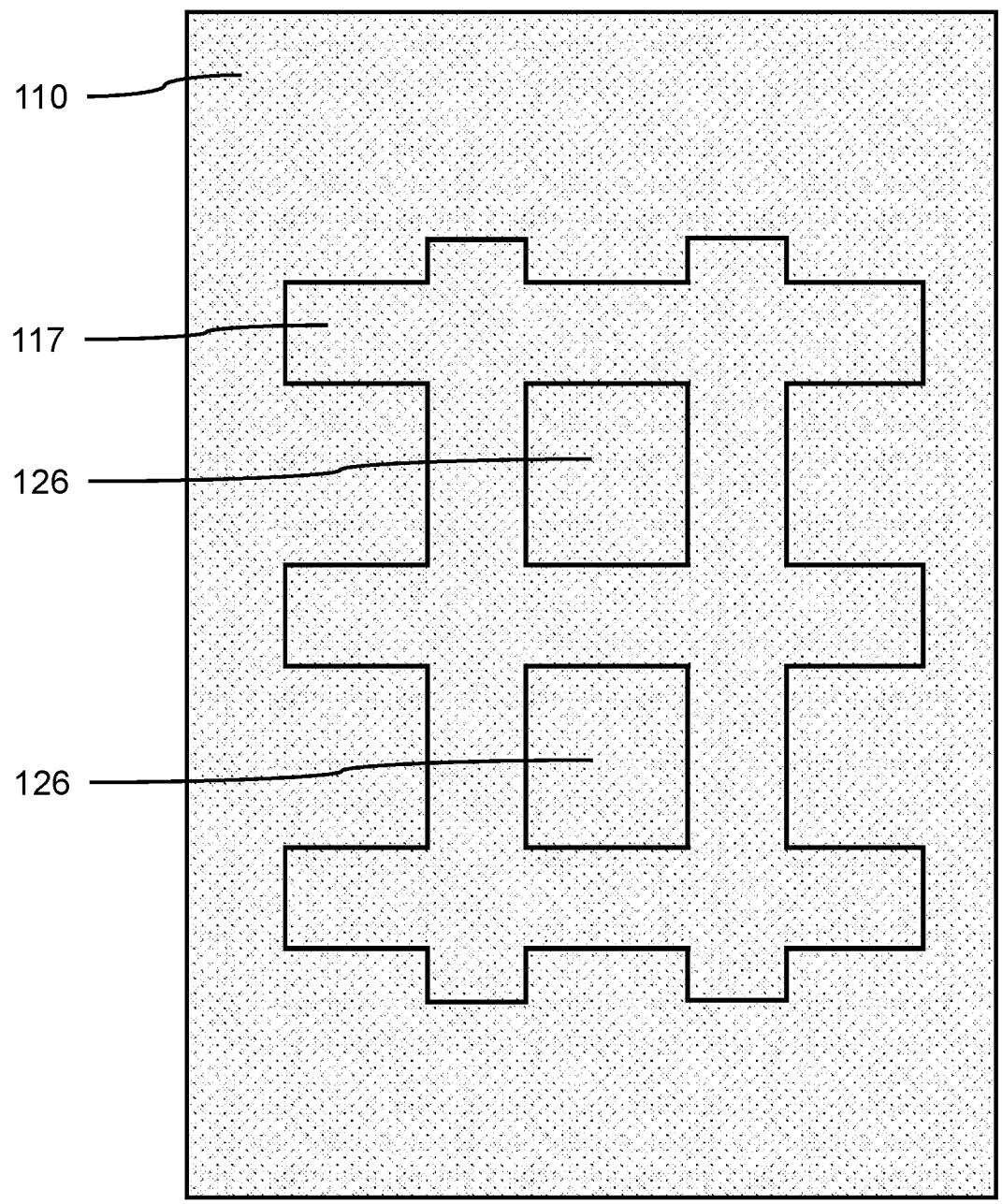
FIG. 8 is a top view showing two-dimensional lattice-type vertical fin formed from the masked, squared openings, in accordance with an embodiment of the present invention.

FIG. 8 is a top view showing two-dimensional lattice-type vertical fin formed from the masked, squared openings, in accordance with an embodiment of the present invention.

In various embodiments, the mask(s) 130 can be removed after etching the substrate 110 to form the lattice-shaped vertical fin 117. In various embodiments, arms can extend away from the intersections varying distances based on the lithography tolerances and mask 130 dimensions. Entire square openings 126 that were covered by a mask 130 can remain within four intersecting walls.

Figure 9:
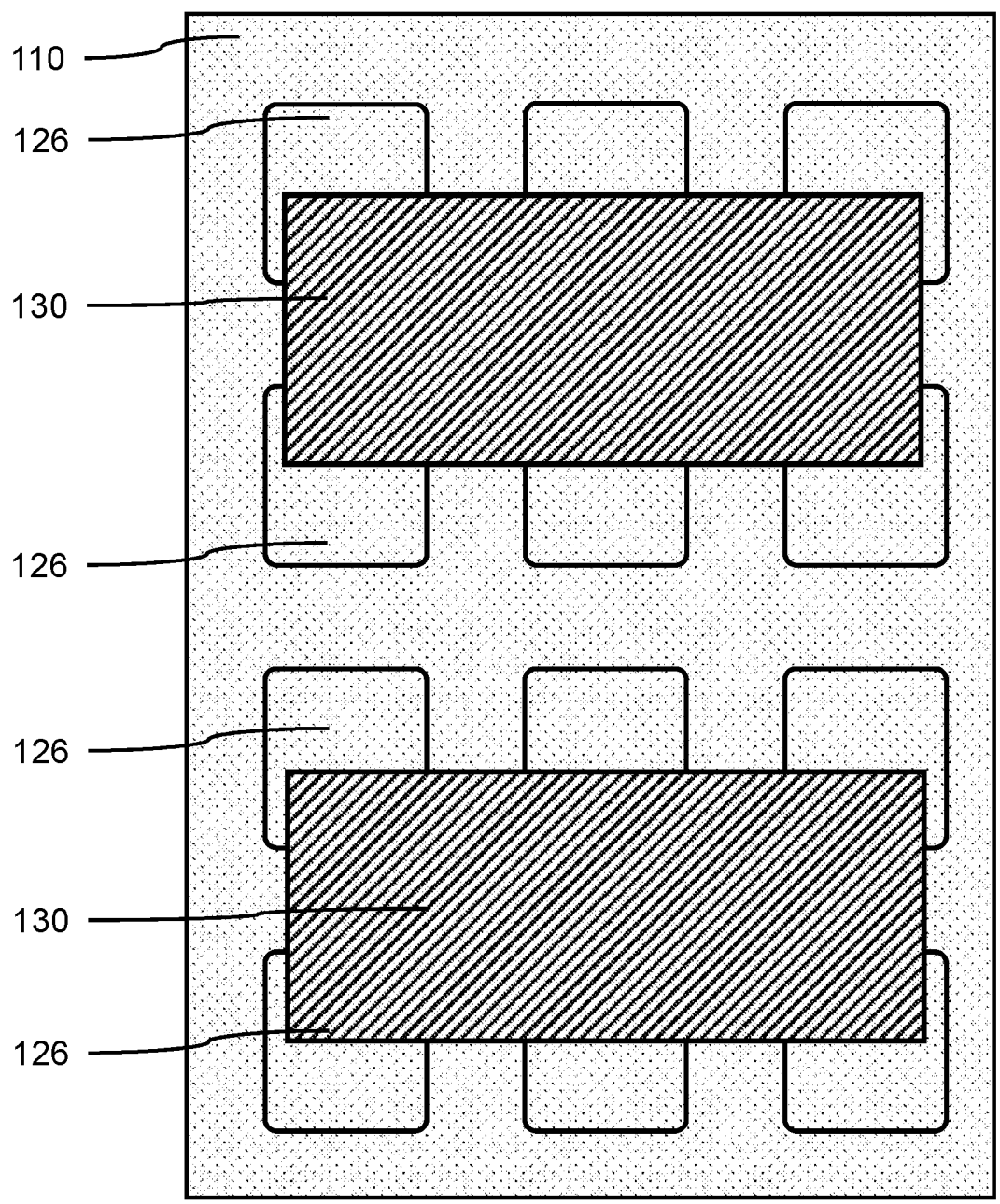
FIG. 9 is a top view showing the squared openings covered by an extended mask, in accordance with an embodiment of the present invention.

FIG. 9 is a top view showing the squared openings covered by an extended mask, in accordance with an embodiment of the present invention.

In one or more embodiments, multiple masks 130 can be formed on the array of square openings 126 to form a plurality of two-dimensions FinFET devices on a region of the substrate 110, where the plurality of masks 130 can be laid out in a regular pattern on the substrate. The number of intersecting walls forming each of the FinFET devices can be determined by the intended drive current for the devices. Multiple FinFET devices with improved uniformity can be fabricated on the substrate due to the selective etching and sharp corners formed at the intersections for each of the vertical fins.

Figure 10:
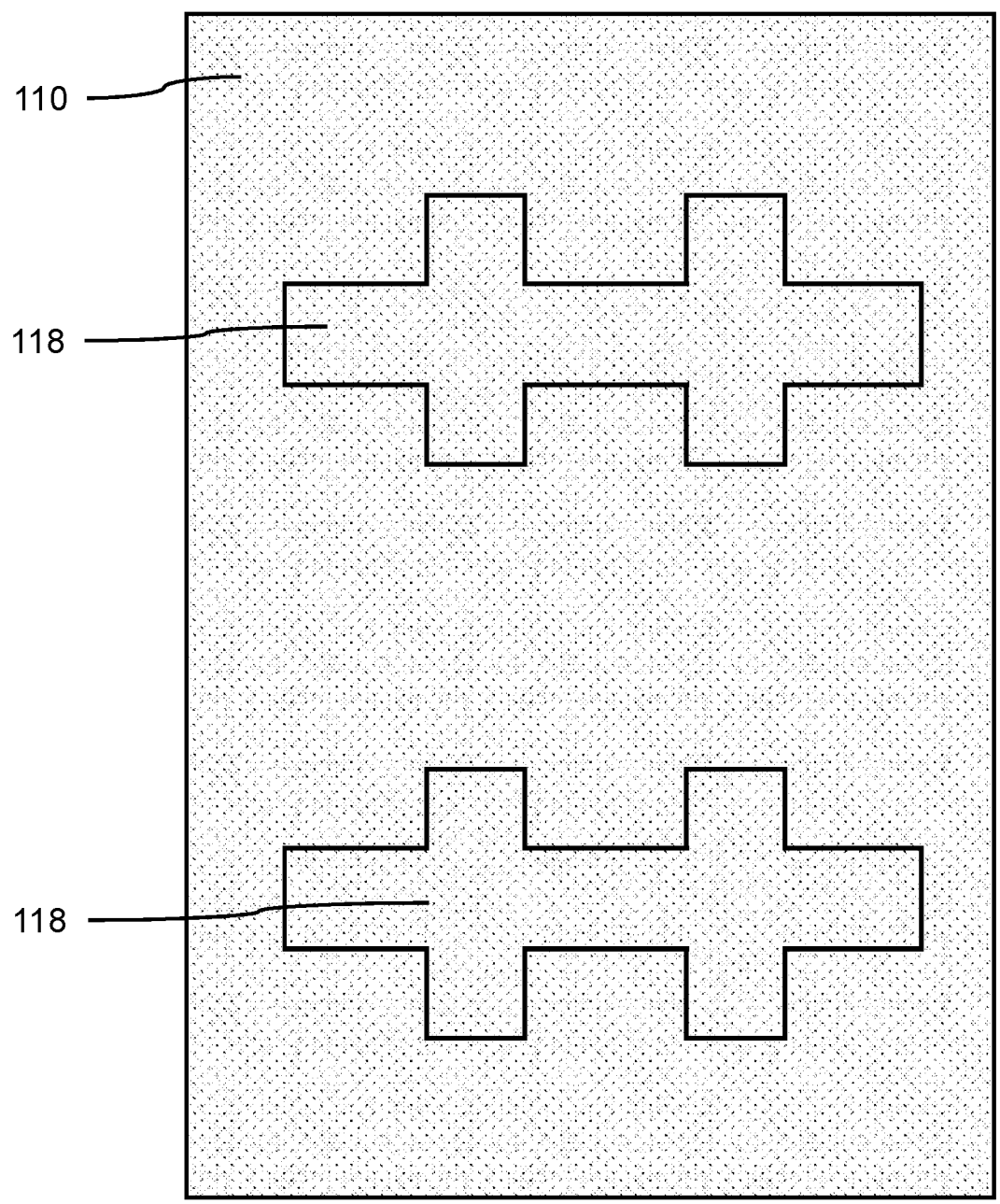
FIG. 10 is a top view showing two-dimensional fence-type vertical fins formed from the masked, squared openings, in accordance with an embodiment of the present invention.

FIG. 10 is a top view showing two-dimensional fence-type vertical fins formed from the masked, squared openings, in accordance with an embodiment of the present invention.

In various embodiments, the mask(s) 130 can be removed after etching the substrate 110 to form the fence-type vertical fins 118. The heights of the vertical fins can be determined by the depth of the directional etch used to remove the surrounding substrate 110. In various embodiments, several different vertical fin shapes can be formed on the same substrate 110 by controlling the mask size and layout over the openings.

Figure 11:
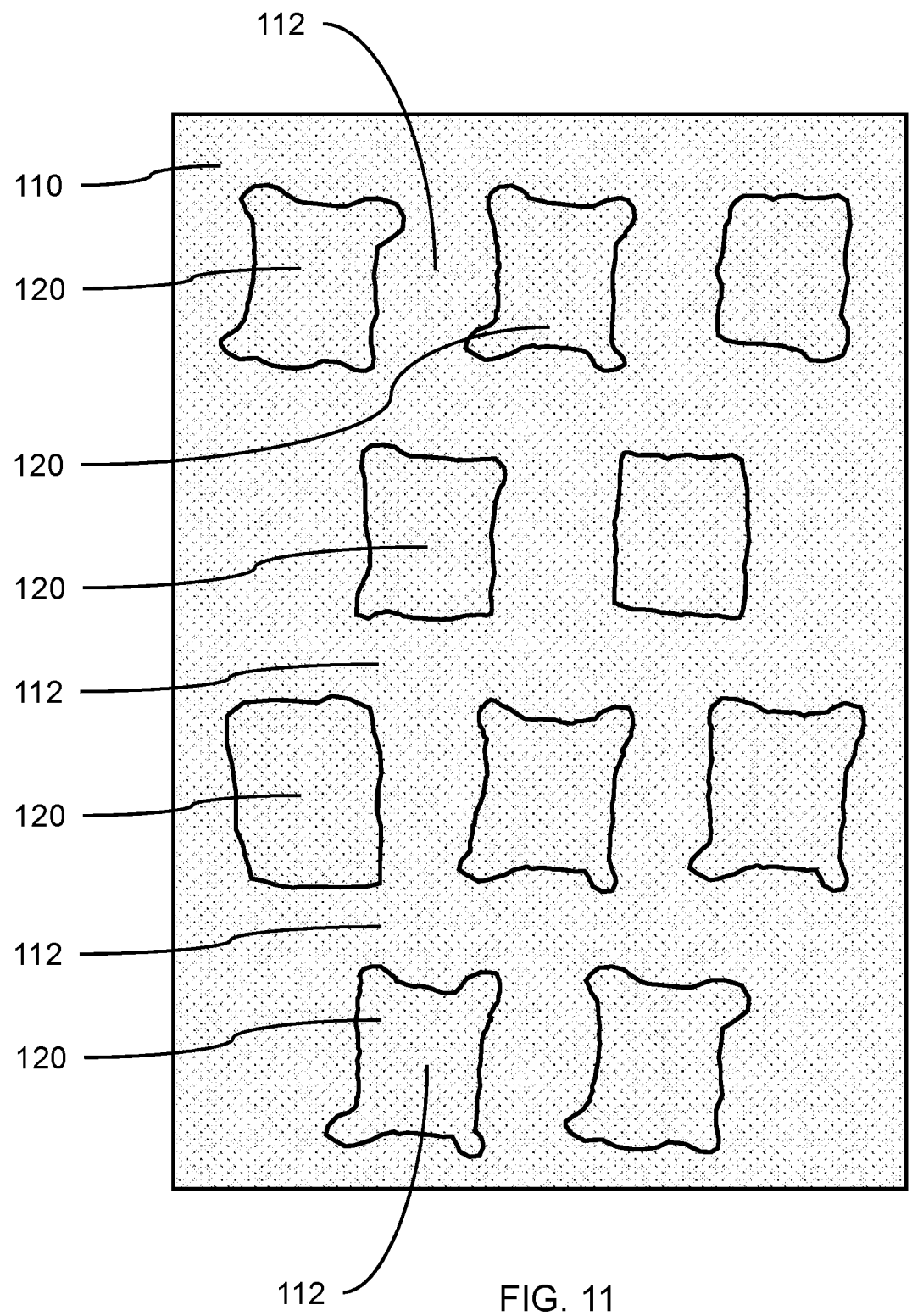
FIG. 11 is a top view showing a periodic hexagonal array with horizontal rows of irregular openings formed in a substrate, in accordance with an embodiment of the present invention.

FIG. 11 is a top view showing a periodic hexagonal array with horizontal rows of irregular openings formed in a substrate, in accordance with an embodiment of the present invention.

In various embodiments, the openings 120 can be arranged in a periodic hexagonal array with horizontal rows, where the openings are staggered between rows. The hexagonal arrangement can be used to form 2D vertical fins with I shapes and square shapes, which are different from the shapes of the vertical fins formed by a rectangular or square lattice of openings.

Figure 12:
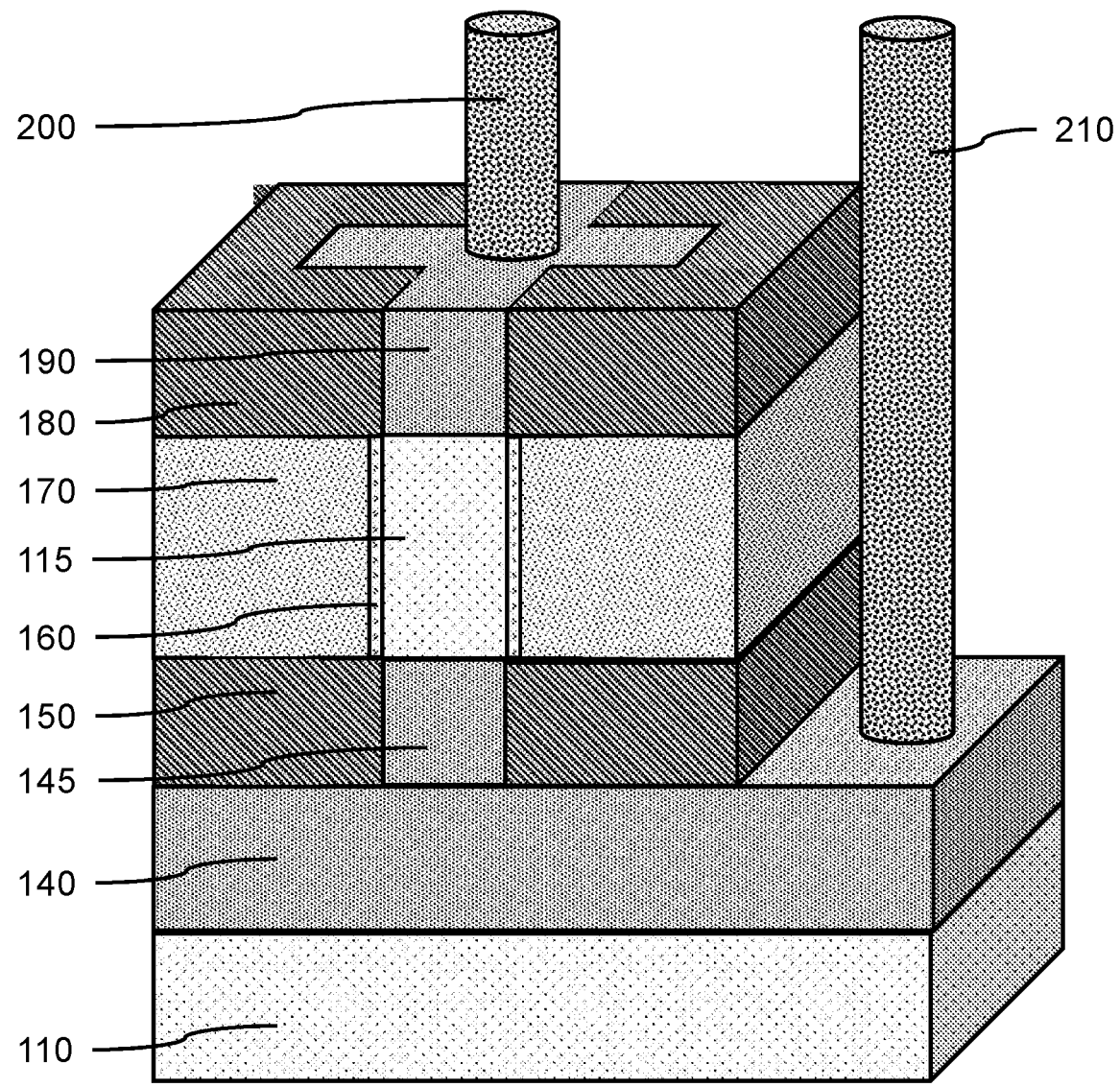
FIG. 12 is a cut-away orthographic view of a fin field effect transistor (FinFET) device formed from a cross-type vertical fin, in accordance with an embodiment of the present invention.

FIG. 12 is a cut-away orthographic view of a fin field effect transistor (FinFET) device formed from a cross-type vertical fin, in accordance with an embodiment of the present invention.

In one or more embodiments, a bottom source/drain 140 can be formed below the vertical fin(s), where the bottom source/drain 140 can be formed from a substrate including a doped (e.g., n-type or p-type) layer and fin layer on the doped layer. The fin layer and doped layer can be epitaxially grown on a surface of a carrier layer of the substrate. In various embodiments, the doped layer can be etched to form an extension region 145 below the vertical fin, for example, a cross-shaped vertical fin 115.

In one or more embodiments, a bottom spacer layer 150 can be formed on the bottom source/drain 140 and extension region 145 if present. The bottom spacer layer 150 can be a dielectric material, for example, silicon oxide (SiO), silicon nitride (SiN), silicon oxynitride (SiON), a low-k dielectric material, or a combination thereof. A low-k dielectric material can be, for example, fluorine doped silicon oxide (SiO:F), carbon doped silicon oxide (SiO:C), hydrogen silsesquioxane (HSQ) and methylsilsesquioxane (MSQ), tetraethoxysilane (TEOS), and combinations thereof.

In one or more embodiments, a gate dielectric layer 160 can be formed on the vertical fin (e.g., cross-shaped vertical fin 115) using a thermal and/or chemical oxidation, for example, thermal oxidation, chemical oxidation, thermal nitridation, plasma oxidation, plasma nitridation, a conformal deposition, for example, atomic layer deposition (ALD) plasma enhanced ALD (PEALD), or a combination thereof. The gate dielectric layer 160 can be a high-k dielectric material.

In one or more embodiments, the gate dielectric layer 160 can be an electrically insulating dielectric material, including but not limited to, silicon oxide (SiO), silicon nitride (SiN), silicon oxynitride (SiON), high-k materials, or any combination of these materials. Examples of high-k materials include, but are not limited to, metal oxides, such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobite (PbZnNbO). The high-k material may further include dopants, such as lanthanum (La), aluminum (Al), magnesium (Mg), and combinations thereof.

In various embodiments, the gate dielectric layer 160 can have a thickness in a range of about 1 nm to about 5 nm, although other thickness are also contemplated.

In one or more embodiments, a conductive gate fill 170 can be formed on the bottom spacer layer 150 and gate dielectric layer 160 to form a gate structure on the vertical fin. The gate structure can wrap around the vertical fin. In various embodiments, a work function metal (WFM) layer can be formed between the gate dielectric layer 160 and the conductive gate fill 170. Also, the conductive gate fill 170 can be a WFM, or include a WMF with other conductive material(s).

In one or more embodiments, the conductive gate fill 170 can be a conducting material, including but not limited to, doped polycrystalline or amorphous silicon (p-Si, a-Si), germanium (p-Ge, a-Ge), silicon germanium (p-SiGe, a-SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotubes, conductive carbon, graphene, or any suitable combination of these materials.

In one or more embodiments, the work function metal (WFM) layer can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In various embodiments, a conductive material or a combination of multiple conductive materials can serve as both gate conductor and WFM.

In one or more embodiments, a top spacer layer 180 can be formed on the conductive gate fill 170, work function metal (WFM) layer, and gate dielectric layer 160. The top spacer layer 180 can be formed by a blanket or directional deposition with or without an etch-back. The top spacer layer 180 can be an electrically insulating dielectric material, for example, silicon oxide (SiO), silicon nitride (SiN), silicon oxynitride (SiON), a low-k dielectric material, or a combination thereof.

In one or more embodiments, a top source/drain 190 can be formed on the vertical fin by epitaxial growth. The top source/drain 190 can be n-doped or p-doped to form a vertical transport fin field effect transistor (VT FinFET) device. In various embodiments, the top source/drain 190 may cover and extend beyond the edges of the vertical fin, such that the top source/drain 190 does not have the same shape as the vertical fin. The bottom source/drain 140 can extend beyond the edges of the vertical fin, or can be a rectangular region in the substrate below one or more vertical fin(s). An interlayer dielectric (ILD) layer can be formed on the gate structure and source/drains, where the ILD layer can be an electrically insulating dielectric material.

In one or more embodiments, a top source/drain contact 200 can be formed to the top source/drain 190, and a bottom source/drain contact 210 can be formed to the bottom source/drain 140. The top source/drain contact 200 and bottom source/drain contact 210 can be a conductive material, for example, a metal, a metal compound, or a combination thereof. The structure may further include other contacts, such as a gate contact. The contact material(s) can be tungsten (W), aluminum (Al), copper (Cu), cobalt (Co), nickel (Ni), titanium (Ti), ruthenium (Ru), molybdenum (Mo), or any other suitable conductive material. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal contact fill material with the top source drain material, and/or other anode/cathode material.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates other rise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms ended to encompass orientations of the device in use or operation addition A the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 demes or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin having multiple arms, comprising:
   heat treating a periodic array of openings having an irregular shape in a substrate, wherein walls of substrate material are disposed between adjacent openings to reduce the surface area of the openings; and
   etching the openings with a crystal-plane selective etch to form squared openings in the substrate.

2. The method of claim 1, further comprising, forming a mask over a plurality of squared openings and at least a portion of the walls between the squared openings that intersect.

3. The method of claim 2, further comprising, removing the portions of the substrate and walls not covered by the mask to form a two-dimensional vertical fin on the substrate.

4. The method of claim 3, wherein the two-dimensional vertical fin has a shape selected from the group consisting of a cross shape, an H-shape, a fence shape, and a lattice-shape.

5. The method of claim 1, wherein the periodic array of irregular openings is arranged as a square lattice, a rectangular lattice, a hexagonal lattice with vertical columns, or a hexagonal lattice with horizontal rows.

6. The method of claim 5, wherein the periodic array of openings having the irregular shape is arranged as a rectangular lattice having walls with different thicknesses between horizontally adjacent openings than vertically adjacent openings.

7. The method of claim 1, wherein the heat treating is selected from the group consisting of a furnace anneal, a rapid thermal anneal (RTA), a flash anneal, a laser anneal, or a combination thereof.

8. The method of claim 7, wherein the heat treating is conducted at a temperature in a range of about 400° C. to about 1200° C.

9. The method of claim 7, wherein the heat treating is conducted for a duration in a range of about 5 seconds (sec) to about 30 minutes (min).

10. The method of claim 7, wherein the heat treating is conducted in an atmosphere including a reducing gas selected from the group consisting of hydrogen gas ($H_2$), deuterium ($D_2$), and combinations thereof.

11. A method of forming a vertical fin having multiple arms, comprising:
    forming a periodic array of openings having an irregular shape in a substrate, wherein walls of substrate material are disposed between adjacent openings;
    heat treating the substrate and openings to reduce the surface area of the openings; and
    etching the openings with a crystal-plane selective etch to form squared openings in the substrate.

12. The method of claim 11, wherein the substrate material is a semiconductor material selected from the group consisting of single crystal silicon (c-Si), silicon-germanium (SiGe), and germanium (Ge), and a {110} crystal plane of the substrate material is selectively etched.

13. The method of claim 12, wherein the crystal-plane selective etch is a wet etch using ammonium hydroxide ($NH_3OH$) or a gas etch using hydrogen chloride (HCl).

14. The method of claim 11, wherein the substrate material is a III-V semiconductor material and a {111} crystal plane of the substrate material is selectively etched.

15. A two-dimensional vertical fin field effect transistor device, comprising:
    a two-dimensional vertical fin having intersecting arms with square corners where perpendicular crystal planes meet.

16. The two-dimensional vertical fin field effect transistor device of claim 15, wherein the two-dimensional vertical fin is a semiconductor material selected from the group consisting of single crystal silicon (c-Si), silicon-germanium (SiGe), and germanium (Ge).

17. The two-dimensional vertical fin field effect transistor device of claim 15, wherein the perpendicular crystal planes are {110} and {−110}, and the square corners are atomically sharp.

18. The two-dimensional vertical fin field effect transistor device of claim 15, wherein the each of the intersecting arms has a thickness in a range of about 5 nm to about 20 nm.

19. The two-dimensional vertical fin field effect transistor device of claim 15, further comprising a top source/drain on the two-dimensional vertical fin, wherein the top source/drain has the same two-dimensional shape as the two-dimensional vertical fin.

20. The two-dimensional vertical fin field effect transistor device of claim 19, further comprising a bottom source/drain adjoining a side of the two-dimensional vertical fin opposite the top source/drain.

* * * * *